(12) United States Patent
Pai

(10) Patent No.: US 8,196,291 B2
(45) Date of Patent: Jun. 12, 2012

(54) METHOD FOR MANUFACTURING LEADS

(75) Inventor: Deepak K. Pai, Burnsville, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 1134 days.

(21) Appl. No.: 11/979,487

(22) Filed: Nov. 5, 2007

(65) Prior Publication Data

US 2008/0106877 A1    May 8, 2008

Related U.S. Application Data

(60) Provisional application No. 60/856,813, filed on Nov. 6, 2006.

(51) Int. Cl.
*H01R 43/00* (2006.01)
(52) U.S. Cl. .............. 29/827; 29/825; 29/832; 174/254
(58) Field of Classification Search .............. 29/825, 29/827, 832, 834; 174/254
See application file for complete search history.

(56) References Cited

U.S. PATENT DOCUMENTS

| | | | | |
|---|---|---|---|---|
| 3,248,779 A | * | 5/1966 | Yuska et al. | 29/854 |
| 3,487,541 A | * | 1/1970 | Boswell | 29/832 |
| 3,519,890 A | | 7/1970 | Ashby | |
| 3,908,075 A | * | 9/1975 | Jackson et al. | 428/133 |
| 4,062,107 A | * | 12/1977 | Blackman et al. | 29/834 |
| 4,647,126 A | | 3/1987 | Sobota, Jr. | |
| 4,673,967 A | | 6/1987 | Hingornay | |
| 4,677,458 A | | 6/1987 | Morris | |
| 4,728,751 A | | 3/1988 | Canestaro et al. | |
| 4,827,611 A | | 5/1989 | Pai et al. | |
| 5,096,425 A | | 3/1992 | Takahashi | |
| 5,198,391 A | | 3/1993 | Rosel et al. | |
| 5,294,039 A | | 3/1994 | Pai et al. | |
| 5,317,479 A | | 5/1994 | Pai et al. | |
| 5,353,621 A | | 10/1994 | Knecht et al. | |
| 5,631,192 A | * | 5/1997 | Heppler et al. | 438/25 |
| 6,830,177 B2 | | 12/2004 | Pai | |
| 2003/0049952 A1 | | 3/2003 | Pai | |

FOREIGN PATENT DOCUMENTS

| | | |
|---|---|---|
| JP | 6126076 | 11/1986 |
| JP | 2004198275 | 7/2004 |

OTHER PUBLICATIONS

'Eigenvector Method for Maximum-Likelihood Estmation of Phase Errors in Synthetic-Aperture-Radar Imagery, by Charles V. Jokowatz, Jr, et al, J.Opt. Soc. Am. A, vol. 10, No. 18, Dec. 1998.

(Continued)

*Primary Examiner* — Carl Arbes
(74) *Attorney, Agent, or Firm* — Ingrassia Fisher & Lorenz, P.C.

(57) ABSTRACT

A system method for manufacturing leads is provided. The method includes providing a conductive sheet, shaping the conductive sheet into at least two opposing longitudinal strips and a plurality of interposing strips, masking lateral sides and a center of the plurality of interposing strips, covering the exposed surface with a conductor and severing the conductive sheet at least along center mask. The plurality of interposing strips are preferably flexible and configurable into desired shapes for potential future attachment to an integrated circuit.

16 Claims, 3 Drawing Sheets

OTHER PUBLICATIONS

"Phase Gradient Autofocus—A Robust Tool for High Resolution SAR Phase Correction," by D. E. Wahl et al, IEEE Transactions of Aerospace and Electronic Systems, vol. 30, No. 3, Jul. 1994, pp. 827-835.

"Synthetic-Aperture Radar Autofocus by maximizing Sharpness," by J. R. Fienup, Optics Letters, vol. 25, No. 4, Optical Society of America, pp. 221-223.

Spotlight Synthetic Aperture Radar, Signal Processing Algorithms, Walter G. Carrara et al, 1995, pp. 1-11.

"A Map Drift Autofocus Technique for Connecting High Order SAR Phase Errors," by C. E. Mancilll et al, Tri- Services Radar Conference, Monterrey, California, Jun. 23-25, 1981.

"Two-Dimensional Phase Gradient Autofocus," by Warner et al.

* cited by examiner

METHOD FOR MANUFACTURING LEADS

CROSS REFERENCE TO RELATED APPLICATIONS

The instant application claims priority to U.S. Provisional Application No. 60/856,813, filed Nov. 6, 2006, the disclosure of which in hereby incorporated by reference in its entirety.

BACKGROUND OF THE INVENTION

1. Field of the Invention

The present invention relates to shaped leads, preferably C-shaped leads. More specifically, the present invention relates to systems and methods for manufacturing C-shaped leads for miniature leadless components and/or the assembly of Printed Circuit Board (PCB) for miniature leadless components that use such leads.

2. Discussion of Background Information

The current generation of leadless components has relatively small solder pads (~0.008 inch—almost twice the thickness of human hair) and small pitch (0.020 inch—almost six times the thickness of human hair). These components typically have relatively lower thermal coefficients of expansion (TCE) than high density boards. Typical solder joints may be acceptable for commercial electronics with low life expectancy of at the most three years, and will therefore not meet 20-year durability requirements of military electronics used in harsh environments.

Shaped leads, particularly C-shaped leads, formed through traditional punch press methodologies are not viable for solder pads of this size due to the size and the softness of pure copper foil.

SUMMARY OF THE INVENTION

According to an embodiment of the invention, a method for manufacturing leads is provided. The method includes providing a conductive sheet, shaping the conductive sheet into at least two opposing longitudinal strips and a plurality of interposing strips, masking lateral sides and a center of the plurality of interposing strips, covering the exposed surface with a conductor and severing the conductive sheet at least along center mask. The plurality of interposing strips are preferably flexible and configurable into desired shapes for potential future attachment to an integrated circuit.

The above-embodiment may have various optional features. For at least one of the severed sections of conductive sheet, the method may also include bending the plurality of interposing strips to form the desired shaped leads, attaching one side of the leads to an integrated circuit, removing the lateral side of the conductive strip, and attaching the other side of the leads to a support. The bending may comprises folding the interposing strips such that the lateral mask is aligned with the center mask. The shaping may comprise etching. The masking may comprise applying a solder mask. The covering may comprises plating. The severing may comprise cutting the conductive sheet approximately down the center of the central mask, wherein the conductive strip is thereby separated into roughly equal sections. The providing may comprises providing a copper-based foil sheet approximately 2-10 mils thick.

According to another embodiment of the invention, a method for manufacturing leads is provided. The method includes providing a conductive sheet in a substantially ladder-shaped pattern, including two lateral supports and a plurality of rungs, applying solder mask on the rungs adjacent to lateral supports and down the center of the rungs to form a center mask and two lateral masks, plating exposed portions of the masked conductive sheet with a conductor; and splitting the conductive sheet down the center mask to form two sections. The plurality of split rungs are preferably flexible and configurable into desired shapes for potential future attachment to an integrated circuit.

The above embodiment may have various optional features. For at least one of the severed sections of conductive sheet, the method may include bending the plurality of interposing strips to form the desired shaped leads, attaching one side of the leads to an integrated circuit, removing the lateral side of the conductive strip, and attaching the other side of the leads to a support. The bending may comprise folding the interposing strips such that the lateral mask is aligned with the center mask. The shaping may comprise etching. The masking may comprise applying a solder mask. The covering may comprises plating. The severing may comprise cutting the conductive sheet approximately down the center of the central mask, wherein the conductive strip is thereby separated into roughly equal sections. The providing may comprises providing a copper-based foil sheet approximately 2-10 mils thick. The center mask may be approximately twice the width of the lateral masks.

According to yet another embodiment of the invention, a method for manufacturing an integrated circuit, is provided. The method includes providing a conductive sheet, etching the conductive sheet to define at least two opposing longitudinal strips and a plurality of interposing strips, applying a mask to lateral sides and a center of the plurality of interposing strips, and severing the conductive sheet at least along the center mask to define separate sections. For at least a portion of one the separate portions, the method also includes bending the plurality of interposing strips to form the desired shaped leads, attaching one side of the leads to an integrated circuit, and removing the lateral side of the conductive strip. The method may further include attaching the other side of the leads to a printed wiring board.

According to yet another embodiment of the invention, an integrated circuit is provided. A plurality of flexible copper-based leads have first and second strips of solder mask. The plurality of leads are folded to define substantially a C-shape, wherein the first and second strips of solder mask are substantially aligned and facing each other inside the C-shape. One side of the outer portion of the C-shape is in electrical contact with the integrated circuit. The other side of the outer portion of the C-shape is configured for electrical contact with another electrical element. The another electrical element may be a printed wiring board.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE EXEMPLARY EMBODIMENT

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
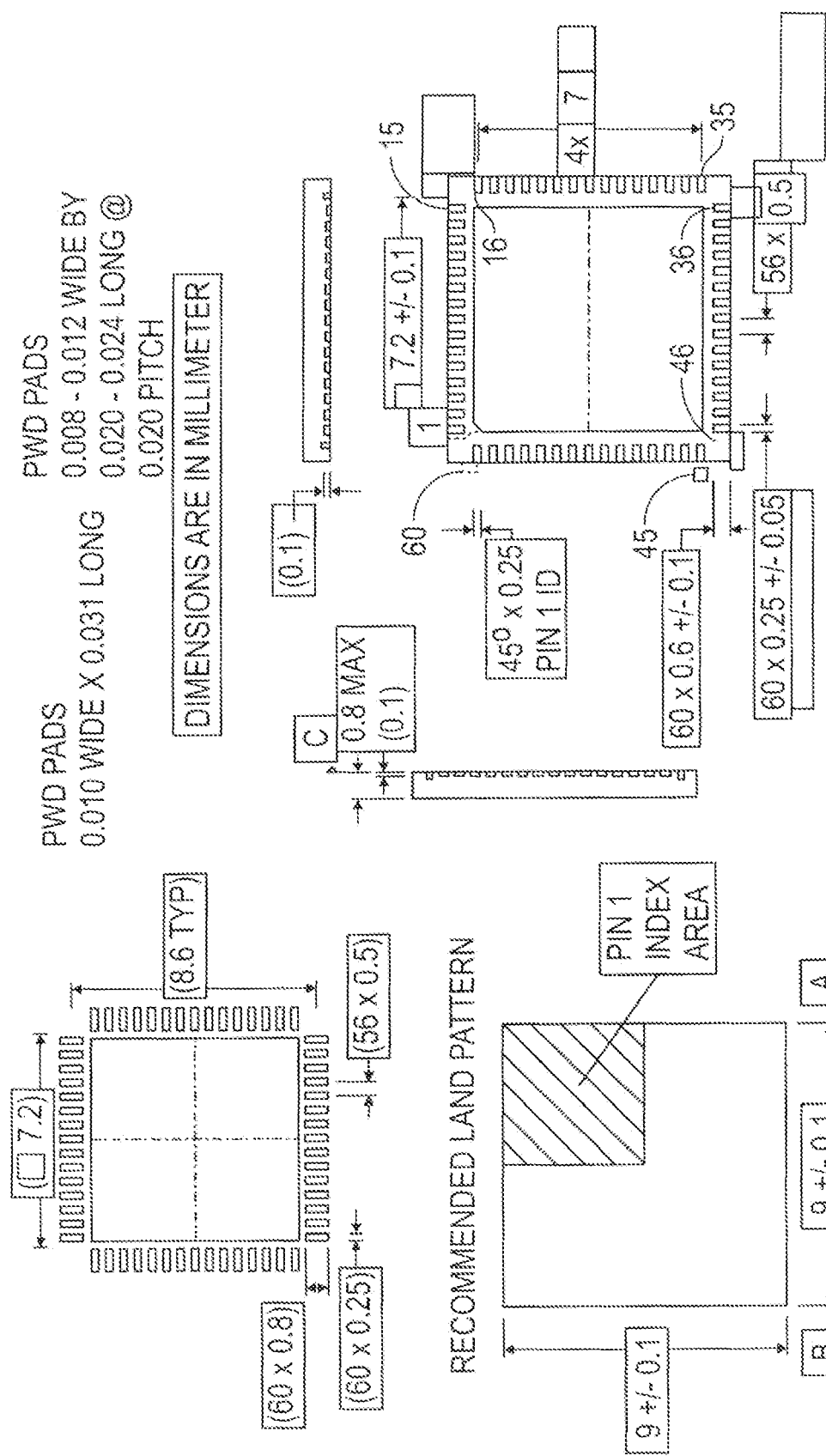
FIG. 1 shows various views of an embodiment of the invention with preferred dimensions.

Examples of miniature leadless components along with associated dimensions are shown in FIG. 1. Embodiments of the present invention are directed to providing C-leads for such components. However, the invention is not so limited, and other applications for the leads and other shapes (e.g., S or Z) can also be used.

Figure 2A:
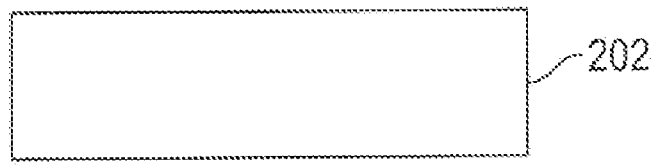
FIGS. 2(a)-2(e) show various production steps of an embodiment of the invention for producing a strip of leads.

Referring now to FIG. 2(a), a metal sheet 202 is provided, preferably made of copper-based materials such as pure copper foil or beryllium copper alloy foil. Sheet 202 is preferably 2-10 mils thick, particularly approximately 5 mils thick. Each sheet 202 defines a frame in a larger sheet (not shown) that measures 18 inches by 24 inches, although any desired dimensions could be used. Each sheet 202 has four holes 204 for alignment and/or mounting purposes, although any number of holes, shapes, and/or alignment methodologies may be used. Each sheet preferably provides approximately 200 leads or lead frames.

Figure 2B:
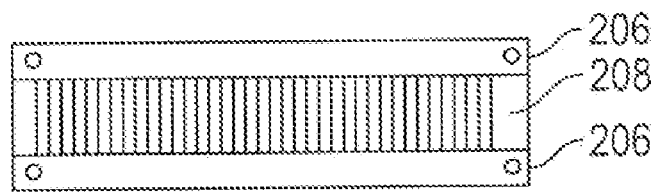

Referring now to FIG. 2(b), a "ladder" pattern is etched into the sheet 202 using standard etching methodologies. The width of the ladder arms 206 is preferably 50-70 mils, particularly 60 mils. Each rung 208 is preferably 3-15 mils wide, particularly approximately 7 or 10 mils. Each rung is separated by gaps of approximately 5-10 mils. Other dimensions could be used based upon the layout of leadless contacts on the chip for which the leads are ultimately intended.

Figure 2C:
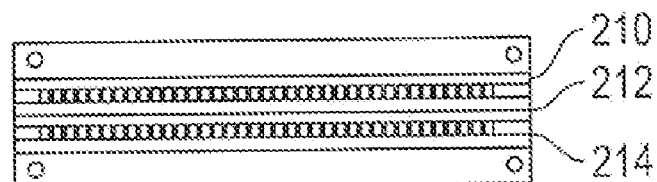

Referring now to FIG. 2(c), a solder mask is applied to sheet 202 to form a top, bottom, and center section 210, 212, and 214. Center section 212 is preferably approximately twice as wide as top and bottom sections 210 and 214. The solder mask is preferably 2-4 mils, approximately 3 mils thick, made of a dry film such as that available from DUPONT®. An appropriate thickness and/or type of mask material may be used as appropriate for the application.

Figure 2D:
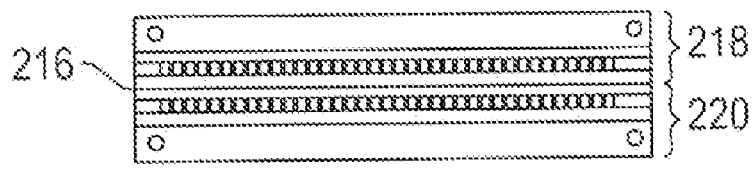

Referring now to FIG. 2(d), the exposed copper is plated with metal. Tin, immersion silver, electroless-nickel-immersion-gold (ENIG) and nickel alloys are non-limiting examples of appropriate metals, although other metals and/or alloys could be used. The plating prevents corrosion and oxidation of the underlying copper from soldering.

Figure 2E:

Referring now to FIG. 2(e), the sheet 202 is cut approximately in half along its longitudinal axis 216 (between the arms 206) to define two halves 218 and 220. Both halves can now be processed in the same way, so further reference will be made to only one of the halves.

Figure 3A:
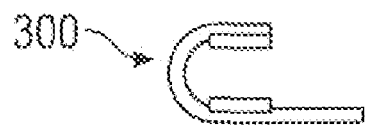
FIGS. 3(a)-3(c) show various production steps of an embodiment of the invention for attaching a strip of leads.

Referring now to FIG. 3(a), C-unit 300 (corresponding to 218 or 220 in FIG. 2(e)) is formed by moving the remaining portion of center section 214. The solder mask holds the leads in place during subsequent soldering.

Figure 3B:
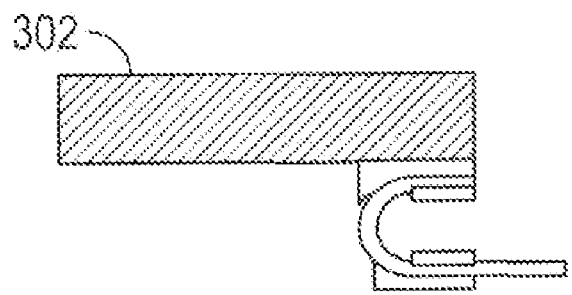
Figure 3C:
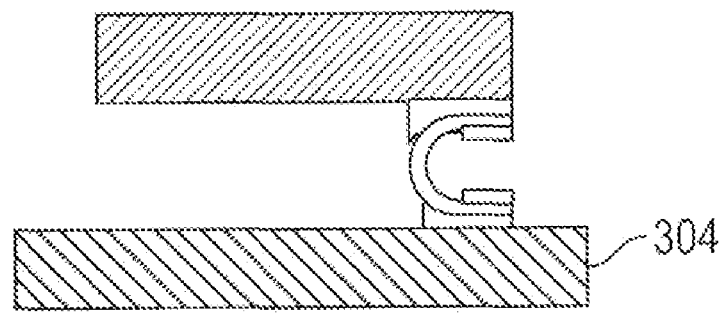

Referring now to FIG. 3(b), the exposed upper surface of C-unit 300 is soldered as appropriate to a leadless chip 302. Any excess portion of C-unit 300 which extends beyond unit 302 (including the former ladder arm 206) can be trimmed through known techniques. Referring now to FIG. 3(c), the exposed lower surface of C-unit 300 is soldered to a printed wiring board 304. This completes the installation.

C-leads manufactured using the above technique have an inherent compliancy from the soft copper. This accommodates any difference in thermal coefficients of expansion between chip 302 and printed wiring board 304. Absent the associated stresses, the lifetime of the solder connection in harsh environments exceeds those of prior methods for chips of this size and is expected to meet the 20-year life expectancy requirements of military and space use.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method for manufacturing leads, comprising:
   providing a conductive sheet;
   shaping the conductive sheet into first and second opposing lateral sides and a plurality of interposing strips that couple the first and second opposing lateral sides, wherein the plurality of interposing strips are substantially parallel to each other;
   masking the first and second opposing lateral sides and a center portion of the plurality of interposing strips while leaving a first set of exposed interposing strips and a second set of exposed interposing strips;
   covering the first set of exposed interposing strips and the second set of exposed interposing strips with a conductor to produce a first covered set of interposing strips and a second covered set of interposing strips; and
   severing the masked center portion to produce a first section and a second section, the first section comprising a first masked lateral side portion connected to a first remaining portion of the masked center portion by the first covered set of interposing strips.

2. The method of claim 1, with respect to the first covered set of interposing strips, further comprising:
   bending the first covered set of interposing strips into a desired shape to form shaped leads having a first side and a second side;
   attaching the first side of the shaped leads to an integrated circuit;
   removing the first masked lateral side portion; and
   attaching the second side of the shaped leads to a support.

3. The method of claim 2, wherein said bending comprises:
   folding the first covered set of interposing strips such that the first masked lateral side portion is aligned with the first remaining portion of the masked center portion.

4. The method of claim 1, wherein said shaping comprises: etching.

5. The method of claim 1, wherein said masking comprises: applying a solder mask to.

6. The method of claim 1, wherein said covering comprises:
   plating the first set of exposed interposing strips and the second set of exposed interposing strips with a conductor.

7. The method of claim 1 wherein said severing comprises:
   cutting the masked center portion approximately down the center.

8. The method of claim 1, wherein said providing comprises:
   providing a copper-based foil sheet approximately 2-10 mils thick.

9. A method for manufacturing leads, comprising:
   providing a conductive sheet having a substantially ladder-shaped pattern comprising: two lateral supports and a plurality of rungs between the two lateral supports that connect the two lateral supports to each other, wherein the plurality of rungs are substantially parallel to each other;
   applying a solder mask along the two lateral supports and along a center portion of the rungs to form a masked conductive sheet comprising: a first set of exposed rung portions, a second set of exposed rung portions, a center masked portion between the first set and the second set, and first and second lateral masked portions;
   plating the first set of exposed rung portions and the second set of exposed rung portions with a conductor to form a first plated set of rung portions and a second plated set of rung portions; and
   splitting the masked conductive sheet along the center masked portion to form: a first section and a second section, the first section comprising the first lateral masked portion connected to a first remaining portion of the center masked portion by the first plated set of rung portions.

10. The method of claim 9, with respect to the first section, further comprising:
    bending the first plated set of rung portions to form a set of shaped leads having a first side and a second side;
    attaching the first side of the shaped leads to an integrated circuit;
    removing the first lateral masked portion; and
    attaching the second side of the shaped leads to a support.

11. The method of claim 10, wherein said bending comprises:
    folding the first plated set of rung portions such that the first lateral masked portion is aligned with the first remaining portion of the center masked portion.

12. The method of claim 9 wherein said splitting the masked conductive sheet along the center masked portion, comprises:
    cutting the masked conductive sheet approximately down a center of the center masked portion.

13. The method of claim 9, wherein said providing comprises:
    providing a copper-based foil sheet approximately 2-10 mils thick.

14. The method of claim 9, wherein said center masked portion is approximately twice a width of the first and second lateral masked portions.

15. A method for manufacturing an integrated circuit, comprising:
    providing a conductive sheet;
    etching the conductive sheet to leave a remaining portion of the conductive sheet, wherein the remaining portion comprises: first and second opposing longitudinal strips, and a plurality of interposing strips that link the first and second opposing longitudinal strips, wherein the plurality of interposing strips are substantially parallel to each other;
    applying a mask to the two opposing longitudinal strips and along a center portion of the plurality of interposing strips to form a masked center portion while leaving a first portion of the plurality of interposing strips exposed;
    severing the conductive sheet at least along the masked center portion to define first and second separate sections, wherein the first separate section comprises: the first opposing longitudinal strip and the first portion of the plurality of interposing strips;
    for the first separate section:
       bending the first portion of the plurality of interposing strips to form a plurality of shaped leads;
       attaching one side of the plurality of shaped leads to an integrated circuit; and
       removing the first opposing longitudinal strip.

16. The method of claim 15, further comprising:
    attaching the other side of the plurality of shaped leads to a printed wiring board.

\* \* \* \* \*